(12) United States Patent
Reinmuth

(10) Patent No.: US 9,038,466 B2
(45) Date of Patent: *May 26, 2015

(54) MICROMECHANICAL COMPONENT AND MANUFACTURING METHOD FOR A MICROMECHANICAL COMPONENT

(75) Inventor: Jochen Reinmuth, Reutlingen (DE)

(73) Assignee: ROBERT BOSCH GMBH, Stuttgart (DE)

(*) Notice: Subject to any disclaimer, the term of this patent is extended or adjusted under 35 U.S.C. 154(b) by 440 days.

This patent is subject to a terminal disclaimer.

(21) Appl. No.: 13/431,613

(22) Filed: Mar. 27, 2012

(65) Prior Publication Data

US 2012/0248931 A1 Oct. 4, 2012

(30) Foreign Application Priority Data

Mar. 30, 2011 (DE) .......................... 10 2011 006 422

(51) Int. Cl.
| | |
|---|---|
| G01P 15/125 | (2006.01) |
| B81B 3/00 | (2006.01) |
| G01P 15/08 | (2006.01) |
| G01L 9/00 | (2006.01) |

(52) U.S. Cl.
CPC ........... *B81B 3/0021* (2013.01); *G01P 15/0802* (2013.01); *G01P 15/125* (2013.01); *G01P 2015/0831* (2013.01); *B81B 2201/0235* (2013.01); *B81B 2201/0264* (2013.01); *G01L 9/0005* (2013.01)

(58) Field of Classification Search
USPC ......................... 73/514.32; 324/661; 361/280
See application file for complete search history.

(56) References Cited

U.S. PATENT DOCUMENTS

| | | | |
|---|---|---|---|
| 4,483,194 A * | 11/1984 | Rudolf ........................ | 73/514.32 |
| 8,749,250 B2 * | 6/2014 | Reinmuth et al. ............. | 324/661 |
| 2010/0107762 A1* | 5/2010 | Classen et al. .............. | 73/514.24 |
| 2012/0038372 A1* | 2/2012 | Reinmuth et al. ............ | 324/661 |

FOREIGN PATENT DOCUMENTS

| | | |
|---|---|---|
| DE | 10 2008 043 788 | 5/2010 |
| DE | 10 2008 043 790 | 5/2010 |

* cited by examiner

*Primary Examiner* — John Chapman, Jr.
(74) *Attorney, Agent, or Firm* — Kenyon & Kenyon LLP

(57) ABSTRACT

A micromechanical component is described having a substrate which has at least one stator electrode fixedly mounted with respect to the substrate, a movable mass having at least one actuator electrode fixedly mounted with respect to the movable mass, and at least one spring via which the movable mass is displaceable. The movable mass is structured from the substrate with the aid of at least one separating trench, at least one outer stator electrode spans at least one section of the at least one separating trench and/or of the movable mass, the at least one actuator electrode protrudes between the at least one outer stator electrode and the substrate, and at least one inner stator electrode protrudes between the at least one actuator electrode and the substrate. A related manufacturing method is also described for a micromechanical component.

24 Claims, 9 Drawing Sheets

(A-A')

(B-B')

(C-C')

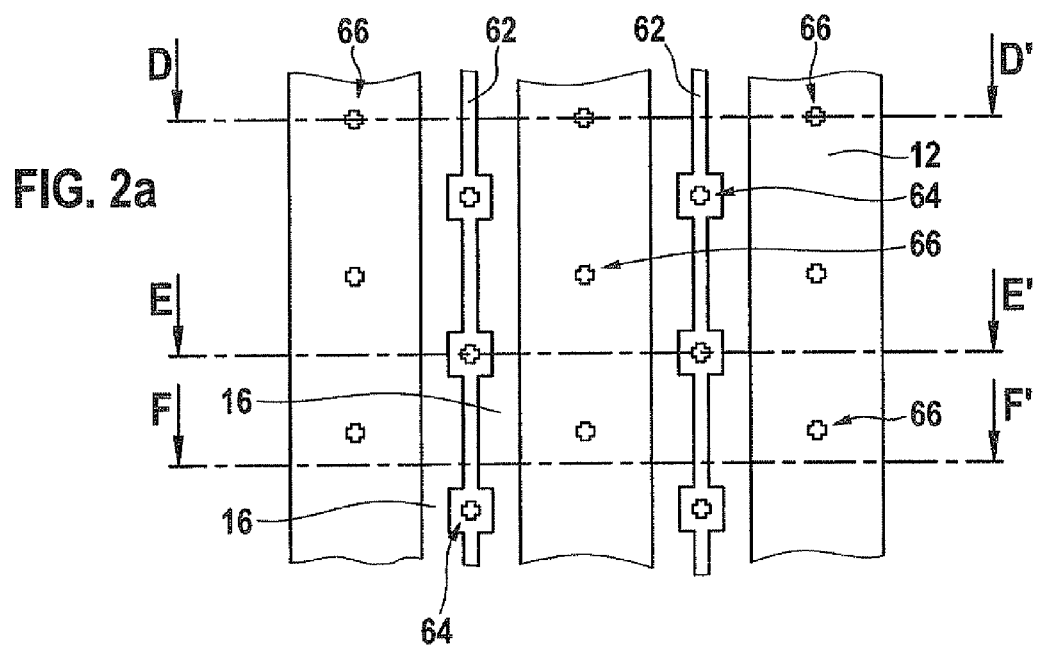
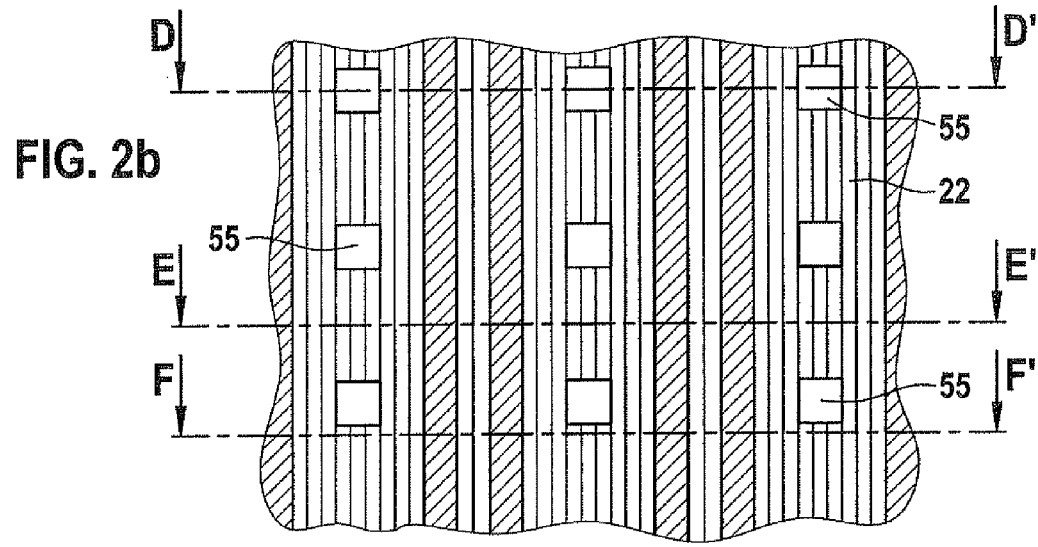

(D-D')

(E-E')

(F-F')

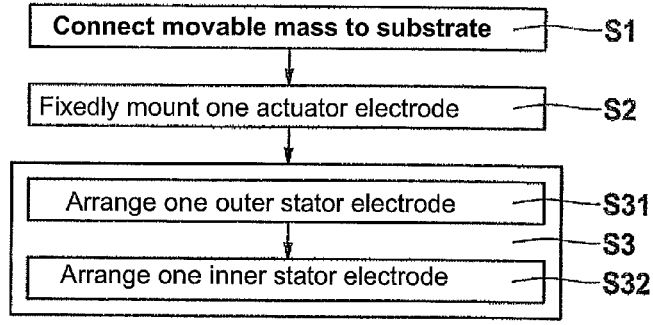
FIG. 4
FIG 5.
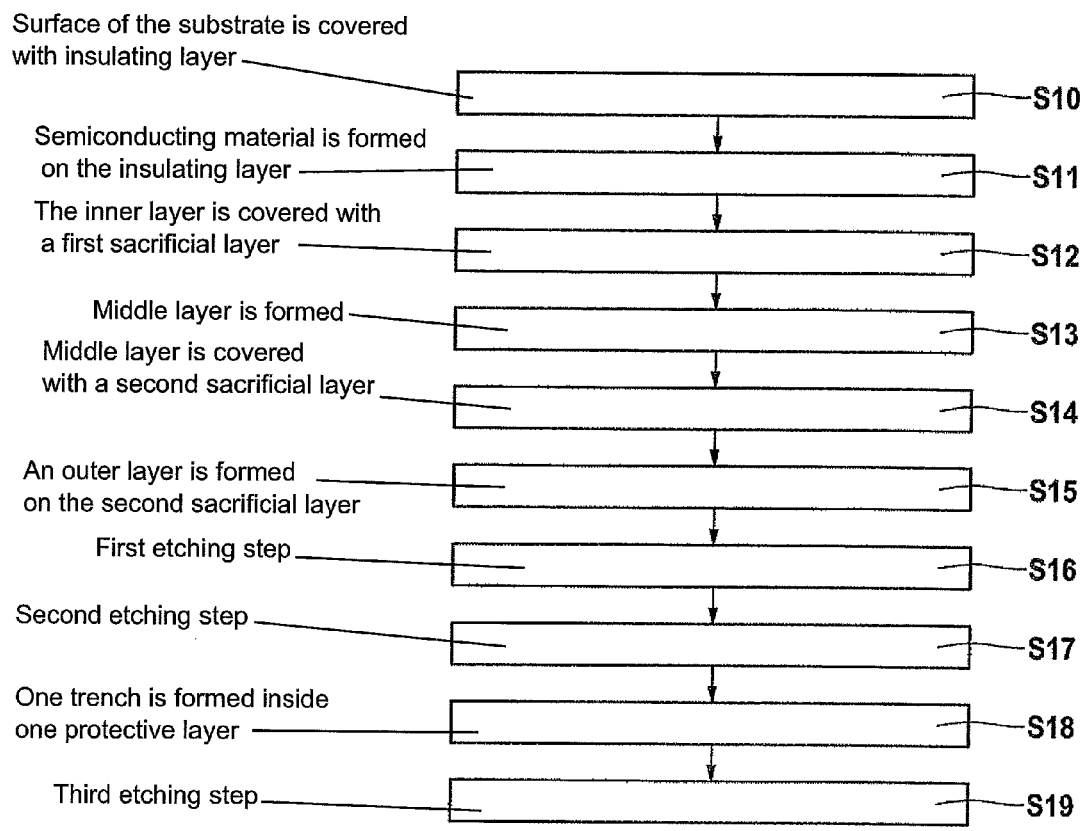

MICROMECHANICAL COMPONENT AND MANUFACTURING METHOD FOR A MICROMECHANICAL COMPONENT

RELATED APPLICATION INFORMATION

The present application claims priority to and the benefit of German patent application no. 10 2011 006 422.2, which was filed in Germany on Mar. 30, 2011, the disclosure of which is incorporated herein by reference.

FIELD OF THE INVENTION

The present invention relates to a micromechanical component. The present invention also relates to a sensor device. Moreover, the present invention relates to a manufacturing method for a micromechanical component and a manufacturing method for a sensor device.

BACKGROUND INFORMATION

German patent document DE 10 2008 043 790 A1 discusses a micromechanical component having a stator electrode situated on a substrate, and a centrifugal mass which is designed as an actuator electrode and is rotatably situated at a distance from the stator electrode. An insulating layer is deposited on the substrate during the manufacture of the micromechanical component. The at least one stator electrode is formed on the insulating layer. A sacrificial layer and a semiconductor layer such as an EPI polysilicon layer, for example, are subsequently deposited on the at least one actuator electrode. In a subsequent method step the centrifugal mass is structured from the semiconductor layer in the form of an asymmetrical rocker.

Also discussed in DE 10 2008 043 788 A1 is a micromechanical component having at least one stator electrode fixedly mounted on a substrate and a rotatably situated centrifugal mass, in the form of an asymmetrical rocker, which is situated at a distance from the stator electrode and structured from a semiconductor layer which is applied to the substrate, and designed as at least one actuator electrode.

SUMMARY OF THE INVENTION

The exemplary embodiments and/or exemplary methods of the present invention provide a micromechanical component having the features described herein, a sensor device having the features described herein, a manufacturing method for a micromechanical component having the features described herein, and a manufacturing method for a sensor device having the features described herein.

The exemplary embodiments and/or exemplary methods of the present invention ensure structuring of the movable mass (and the at least one spring) from the substrate. It is therefore not necessary to deposit/form an additional semiconductor layer on an insulating layer/sacrificial layer, formed on the substrate, from which the movable mass is formed in the related art. The problems which frequently occur during the manufacture of a silicon-on-insulator (SOI) design are thus eliminated using the technology according to the present invention. In addition, compared to the related art, work steps in the manufacturing method may be spared. The manufacturing costs for the micromechanical component according to the exemplary embodiments and/or exemplary methods of the present invention may thus be reduced.

Furthermore, the exemplary embodiments and/or exemplary methods of the present invention ensure an advantageous arrangement of at least one inner stator electrode and at least one outer stator electrode at a comparatively small distance from the at least one actuator electrode, the at least one inner stator electrode being situatable at a first side, and the at least one outer stator electrode being situatable at an opposite second side of the at least one actuator electrode. In particular, the small distance between the at least one inner stator electrode and the at least one actuator electrode and between the at least one outer stator electrode and the at least one actuator electrode may be ensured, regardless of an extension of the movable mass perpendicular to the electrodes.

It is pointed out that with the aid of the technology according to the exemplary embodiments and/or exemplary methods of the present invention, all electrodes are situatable in such a way that the mechanical properties of the electrodes are able to cause little or no mechanical stresses in the substrate or in the movable mass. It is therefore not necessary to structure the substrate, using a front-side and/or back-side etching process, in such a way that semiconductor webs are still formed under a MEMS metal layer (microsystem technology metal layer), which usually are to be formed with a greater width than the at least one metal printed conductor. This has the advantage that it is not necessary to carry out back-side processes for producing the supporting semiconductor webs.

In one advantageous specific embodiment, the at least one outer stator electrode is connected to the substrate with the aid of at least one stator supporting component situated in the first space, and/or the at least one actuator electrode is connected to the movable mass with the aid of at least one actuator supporting component situated in the second space. A reliable hold of the at least one outer stator electrode and of the at least one actuator electrode on the substrate may thus be ensured, regardless of a motion of the movable mass. In addition, the at least one actuator electrode is easily attachable to the movable mass.

A row-column pattern of the actuator supporting components may be offset with respect to a row-column pattern of the stator supporting components in such a way that one of the stator supporting components protrudes into a rectangle composed of four actuator supporting components, at an equal distance from the four actuator supporting components, and one of the actuator supporting components protrudes into a rectangle composed of four stator supporting components, at an equal distance from the four stator supporting components. The advantageous hold of the at least one outer stator electrode on the substrate and of the at least one actuator electrode on the movable mass may be improved in this way.

At least one integrated sensor and/or evaluation device is/may be provided in and/or on the substrate. For example, the integrated sensor and/or evaluation device may be implemented as a CMOS circuit within a single chip using MEMS structures. This ensures that the micromechanical component is provided with a sensor and/or evaluation device in an economical and space-saving manner.

The micromechanical component may include an outer layer made of conductive material which includes the at least one outer stator electrode, a middle layer made of conductive material which includes the at least one actuator electrode, and an inner layer made of conductive material which includes the at least one inner stator electrode, at least one buffer area which includes at least one insulating material and/or one conductive material being provided between the outer layer and the middle layer and/or between the middle layer and the inner layer. This ensures simple manufacturing of the micromechanical component, for example with the aid of the method described in greater detail below. An insulating buffer area prevents a flow of current between two adjacent layers. Alternatively, an electrical signal and/or a supply current may be relayed from a first layer to an adjacent second layer via a conductive buffer area. Likewise, by providing a buffer area made of a solid material, for example a metal and/or a semiconductor material, it may be ensured that the regions of the two adjacent layers contacting the intermediate layer do not change position relative to one another, even under the action of a force.

In one particularly advantageous specific embodiment, the movable mass is tiltable with respect to the substrate about a rotational axis which extends along the at least one spring, and the rotational axis divides the movable mass into a first partial mass having a first weight, and a second partial mass having a second weight which is less than the first weight. In other words, the movable mass is designed as an asymmetrical rocker which is tiltable about a rotational axis which extends along the at least one spring. This type of asymmetrical rocker responds even to a slight acceleration and/or a slight change in pressure. Thus, usability of the micromechanical component in a sensor device is ensured in particular with such a design of the movable mass.

In addition, the first partial mass and the second partial mass may each include a connecting web and multiple finger webs situated at the associated connecting web, the first partial mass also including an additional mass situated at the ends of its finger webs, facing away from its connecting web. This ensures a sufficient asymmetrical distribution of mass between the two partial masses, even with a comparatively small overall mass of the movable mass. Thus, the micromechanical component may be designed with a small overall mass and with small space requirements.

Furthermore, the finger webs may have widenings in the actuator contact areas of the at least two actuator supporting components which contact the finger webs, and may have a narrower design between two adjacent actuator contact areas of a finger web. Thus, material may be spared for the areas between the widenings, as a result of which the average width of the finger webs is reducible.

In another advantageous specific embodiment, the at least one outer stator electrode and/or the at least one actuator electrode include(s) gridded areas composed of jagged strands which are kinked and/or bent at right angles. Transmission of mechanical stress may be counteracted with the aid of such a design of the at least one outer stator electrode and/or the at least one actuator electrode.

In one refinement, the micromechanical component may include a coil which is fixedly mounted with respect to the movable mass. In this case, the micromechanical component is also usable for a magnetic sensor.

The advantages described in the above paragraphs are also ensured for a sensor device having this type of micromechanical component. In addition, the sensor device may include an evaluation device which is designed to ascertain a first variable concerning a first capacitance of a first capacitor formed from the at least one outer stator electrode and the at least one actuator electrode, and to ascertain a second variable concerning a second capacitance of a second capacitor formed from the at least one inner stator electrode and the at least one actuator electrode, and to determine and output information concerning an acceleration exerted on the movable mass, a pressure exerted on the movable mass, and/or a magnetic field in a region of a coil which is fixedly mounted with respect to the movable mass, taking the ascertained first variable and the ascertained second variable into account. In one specific embodiment, the sensor device may include an integrated evaluation circuit. For example, the evaluation circuit may be implemented as a CMOS circuit within a single chip using the MEMS structures.

One advantageous specific embodiment of the sensor device according to the present invention is an acceleration sensor, with the aid of which an acceleration (of the acceleration sensor), having a component which is oriented perpendicularly to the surface area of the substrate, not equal to zero is recognizable/detectable/measurable. Such an acceleration sensor is frequently also referred to as a Z sensor. In particular, a Z sensor for very high capacitances and/or changes in capacitance may be manufactured with the aid of the technology according to the exemplary embodiments and/or exemplary methods of the present invention.

It is pointed out that acceleration sensors which, as an alternative or supplement to the functionality of a Z sensor, are suited for recognizing/measuring an acceleration (of the acceleration sensor) in a direction parallel to the surface area of the substrate (X or XY acceleration sensors) may also be formed with the aid of the technology according to the exemplary embodiments and/or exemplary methods of the present invention described herein.

Due to the advantageous arrangement of the stator electrodes on both sides of and at a small distance from the at least one actuator electrode, even a slight displacement motion of the at least one actuator electrode may be reliably detected and/or ascertained/measured. In particular, the micromechanical component may be used for a sensor, in particular a Z sensor, having a two-sided (differential) electrode arrangement. A sensor equipped with the micromechanical component is characterized by a very good response to external influences, which is ensured over the entire service life of the sensor. The achievable symmetrical design at the micromechanical component may also contribute to averaging out interference effects.

However, the sensor device is not limited to a design as an acceleration sensor. For example, the sensor device may also be designed as a pressure sensor, whereby a change in pressure may result in a displacement motion of the movable mass which is detectable.

In another specific embodiment it is possible to mount/provide a coil on the movable mass. In this case the micromechanical component according to the present invention may be used as a sensitive element of a magnetic field sensor. When a magnetic field strength changes over time due to an induced current flow through the coil, a deflection/displacement motion of the movable mass occurs. A variable concerning the magnetic field strength may thus be identified/determined by a capacitive measurement.

However, the usability of the micromechanical component is not limited to an acceleration sensor, a pressure sensor, and/or a magnetic field sensor.

The above-mentioned advantages may also be ensured with the aid of the corresponding manufacturing method for a micromechanical component.

At the same time, the technology according to the exemplary embodiments and/or exemplary methods of the present invention, described in greater detail below, ensures an option for manufacturing a micromechanical component having a mass which is movable with respect to a substrate and at least one stator electrode which is fixedly mounted with respect to the substrate, the etching steps to be carried out for structuring the movable mass and the at least one spring from the substrate and the deposition steps/etching steps to be carried out for forming the at least one stator electrode needing to be performed only from one side of the substrate. In other words, only front-side processes are to be carried out for manufacturing the micromechanical component according to the present invention, while carrying out back-side processes is not necessary. Thus, the manufacturing method is strictly a front-side process. Complicated back-side process steps do not have to be used for carrying out the manufacturing method. It is therefore sufficient to protect the sensor structures only on the front side.

In the manufacturing method, the manufacturing steps of complementary metal oxide semiconductor (CMOS) manufacture and of MEMS manufacture may proceed separately without adversely affecting one another. In particular, all method steps for manufacturing the MEMS structures may be carried out only after the actual CMOS manufacturing process. The known good mechanical and electrical properties of silicon MEMS sensors may be combined with the good properties of metal-based MEMS sensors without having to take the disadvantages thereof into account.

In one refinement, the manufacturing method may be part of a manufacturing method for a sensor device. The above-described advantages are thus also achievable for manufacturing a sensor device, for example an acceleration sensor, a pressure sensor, and/or a magnetic sensor.

Further features and advantages of the present invention are explained below with reference to the figures.

BRIEF DESCRIPTION OF THE DRAWINGS

FIGS. 2a, 2b, 2c, 2d, and 2e show cross sections of a substrate and top views of various layers of the substrate for illustrating a second specific embodiment of the micromechanical component.

FIG. 4 shows a flow chart for illustrating a first specific embodiment of the manufacturing method; and FIG. 5 shows a flow chart for illustrating a second specific embodiment of the manufacturing method.

DETAILED DESCRIPTION

FIGS. 1a through 1e show cross sections of a substrate and top views of various layers of the substrate for illustrating a first specific embodiment of the micromechanical component.

Figure 1A:
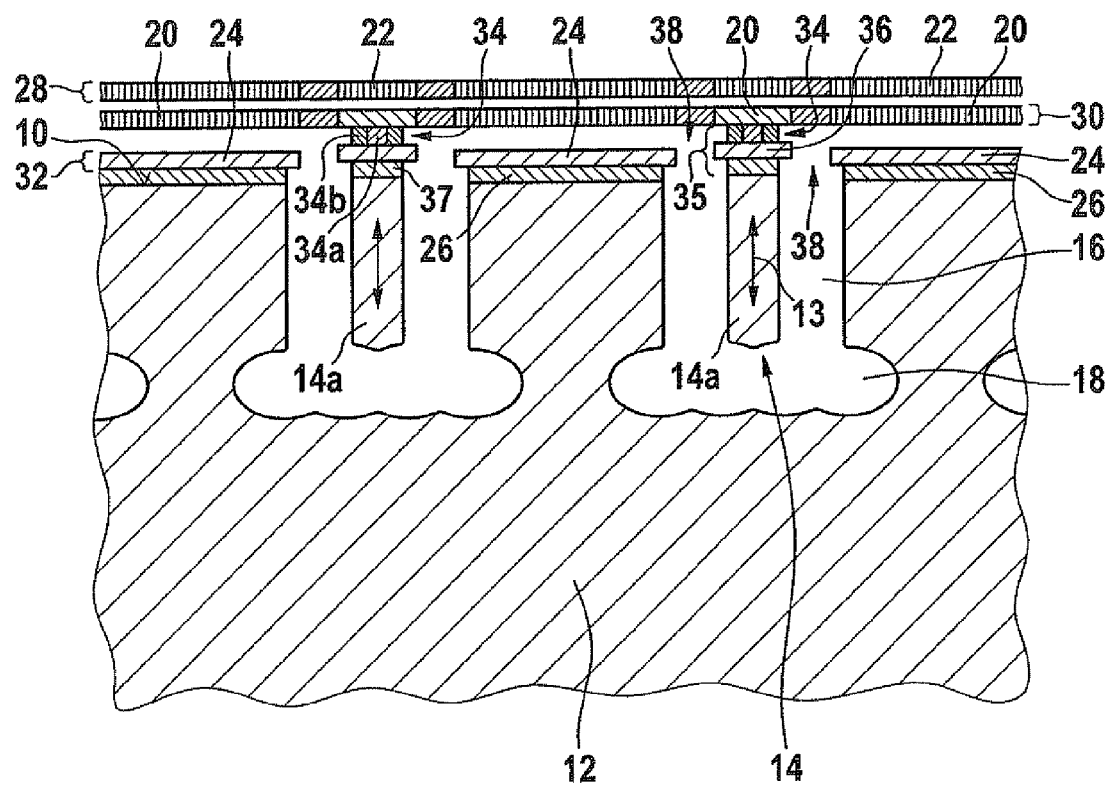
FIGS. 1a, 1b, 1c, 1d, and 1e show cross sections of a substrate and top views of various layers of the substrate for illustrating a first specific embodiment of the micromechanical component.

FIG. 1a shows a cross section of the schematically represented micromechanical component.

The illustrated cross section extends perpendicularly to a front side 10 of a substrate 12 of the micromechanical component. Substrate 12 may, for example, be a semiconductor substrate, in particular a silicon substrate. Instead of or in addition to silicon, however, substrate 12 may include at least one other semiconductor material and/or at least one metal. Substrate 12 may be a CMOS wafer. Regions of substrate 12 which are not needed as MEMS structures, such as a CMOS circuit region, may be covered by a protective layer during production of the components of the micromechanical component described below, the protective layer being subsequently removable. However, the practicability of the micromechanical component is not limited to the use of a CMOS wafer.

The micromechanical component also has a movable mass 14 which is connected via at least one spring (not illustrated in FIG. 1a) to substrate 12 in such a way that movable mass 14 is displaceable with respect to the substrate at least from a first position to a second position (arrow 13). Movable mass 14 is structured from substrate 12 with the aid of at least one separating trench 16 and 18. For example, first separating trenches 16 may extend perpendicularly away from front side 10. Isotropically etched second separating trenches 18 may leave at least one bottom side of movable mass 14, facing away from front side 10, open with respect to substrate 12. One particularly advantageous method for forming separating trenches 16 and 18 is discussed in greater detail below.

The micromechanical component also has at least one actuator electrode 20, at least one outer stator electrode 22, and at least one inner stator electrode 24. The at least one actuator electrode 20 is arranged in such a way that it is fixed with respect to movable mass 14. In other words, the at least one actuator electrode 20 is displaceable together with movable mass 14. On the other hand, the at least one outer stator electrode 22 and the at least one inner stator electrode 24 are fixedly mounted with respect to substrate 12. Thus, a motion of movable mass 14 (and of the at least one actuator electrode 20) does not influence the positions of the at least one outer stator electrode 22 and of the at least one inner stator electrode 24 with respect to substrate 12.

The at least one outer stator electrode 22 spans at least one section of the at least one separating trench 16 and 18 and/or of movable mass 14 (shown in greater detail in the figures described below). A first space is thus definable between the at least one outer stator electrode 22 and front side 10 of substrate 12. The at least one actuator electrode 20 protrudes at least into the first space. In other words, the at least one actuator electrode 20 is situated at least partially between the at least one outer stator electrode 22 and substrate 12. The at least one inner stator electrode 24 protrudes at least into a second space between the at least one actuator electrode 20 and substrate 12, i.e., is situated between the at least one actuator electrode 20 and substrate 12. This is easily achievable, for example, by applying an insulating layer 26 to front side 10, on which the at least one inner stator electrode 24 is formed. Insulating layer 26 may be, for example, an oxide layer, in particular a thermally formed silicon oxide layer. Electrodes 20 through 24 may include at least one metal and/or at least one doped semiconductor material.

The micromechanical component may have a layered structure composed of at least one outer layer 28 made of conductive material, including the at least one outer stator electrode 22, a middle layer made of conductive material 30, including the at least one actuator electrode 20, and an inner layer 32 made of conductive material, including the at least one inner stator electrode 24. Layers 28 through 32 may have the same material composition, and in particular may be made of the same material. Likewise, layers 28 through 32 may be formed from different conductive materials, or from different compositions of at least two conductive materials.

At least one buffer area 34 which includes at least one insulating material and/or one conductive material may be provided between outer layer 28 and middle layer 30, and/or between middle layer 30 and inner layer 32. Subregions of various layers 28 through 32 may be connected to one another, at least mechanically, with the aid of the at least one buffer area 34. Use of at least one metal or at least one (doped) semiconductor material in a buffer area 34 improves the mechanical hold of subregions of various layers 28 through 32, and may also be used for electrically connecting subregions of various layers 28 through 32. This type of buffer area 34 may include in particular a core region 34a made of at least one metal or at least one semiconductor material, and a border region 34b, enveloping core region 34a, made of at least one insulating material. On the other hand, a mechanical connection between subregions of various layers 28 through 32 may be ensured, even without an electrical connection, via a buffer area which is formed solely from an insulating material, as shown in a figure described below.

The at least one actuator electrode may be connected to movable mass 14 via at least one actuator supporting component 35. In the illustrated specific embodiment, the at least one actuator supporting component 35 includes one buffer area 34, one connecting region 36 made of inner layer 32, and one region 37 of insulating layer 26. Connecting region 36 and region 37 of insulating layer 26 are each structured/separated from inner layer 32 or insulating layer 26 with the aid of a completely surrounding intermediate gap 38. Connecting region 36 is thus electrically insulated from the at least one inner electrode 24. In this case, a fixed connection of actuator electrode 20 to movable mass 14 may be achieved via the at least one connecting region 36, although the at least one inner stator electrode 24 is situated between the at least one actuator electrode 20 and front side 10, and the top side of movable mass 14 situated at front side 10. Thus, it is not necessary to place movable mass 14 between actuator electrode 20 and the at least one outer stator electrode or inner stator electrode 22 or 24, respectively.

Instead, movable mass 14 may protrude from front side 10 into an inner space of substrate 12 which is formed by separating trenches 16 and 18, while electrodes 20 through 24 are situated closely next to one another at front side 10. The micromechanical component may thus have a very small design. Due to this close arrangement of electrodes 20 through 24, even a slight displacement motion of the at least one actuator electrode 20 is reliably detectable. In this case, in particular an acceleration of movable mass 14 or a change in pressure acting on movable mass 14 results in a comparatively large change in capacitance, which may be detected/ascertained even using inexpensive electronics. In addition, the arrangement of at least two stator electrodes 22 and 24 on two different sides of the same actuator electrode 20, which may also be referred to as a differential electrode system, ensures advantageous measuring sensitivity and a comparatively high degree of robustness/immunity of the ascertained values with respect to external influences.

The at least one outer stator electrode 22 may also be connected to substrate 12 via at least one stator supporting component situated in the first space, as described in greater detail below.

Electrodes 20 through 24 may be contacted from a side edge (not illustrated) of the micromechanical component. This type of electrical contact may be easily and inexpensively produced. Alternatively or additionally, an electrical contact may extend across the at least one actuator supporting component 35 and/or across the at least one stator supporting component.

Figure 1B:
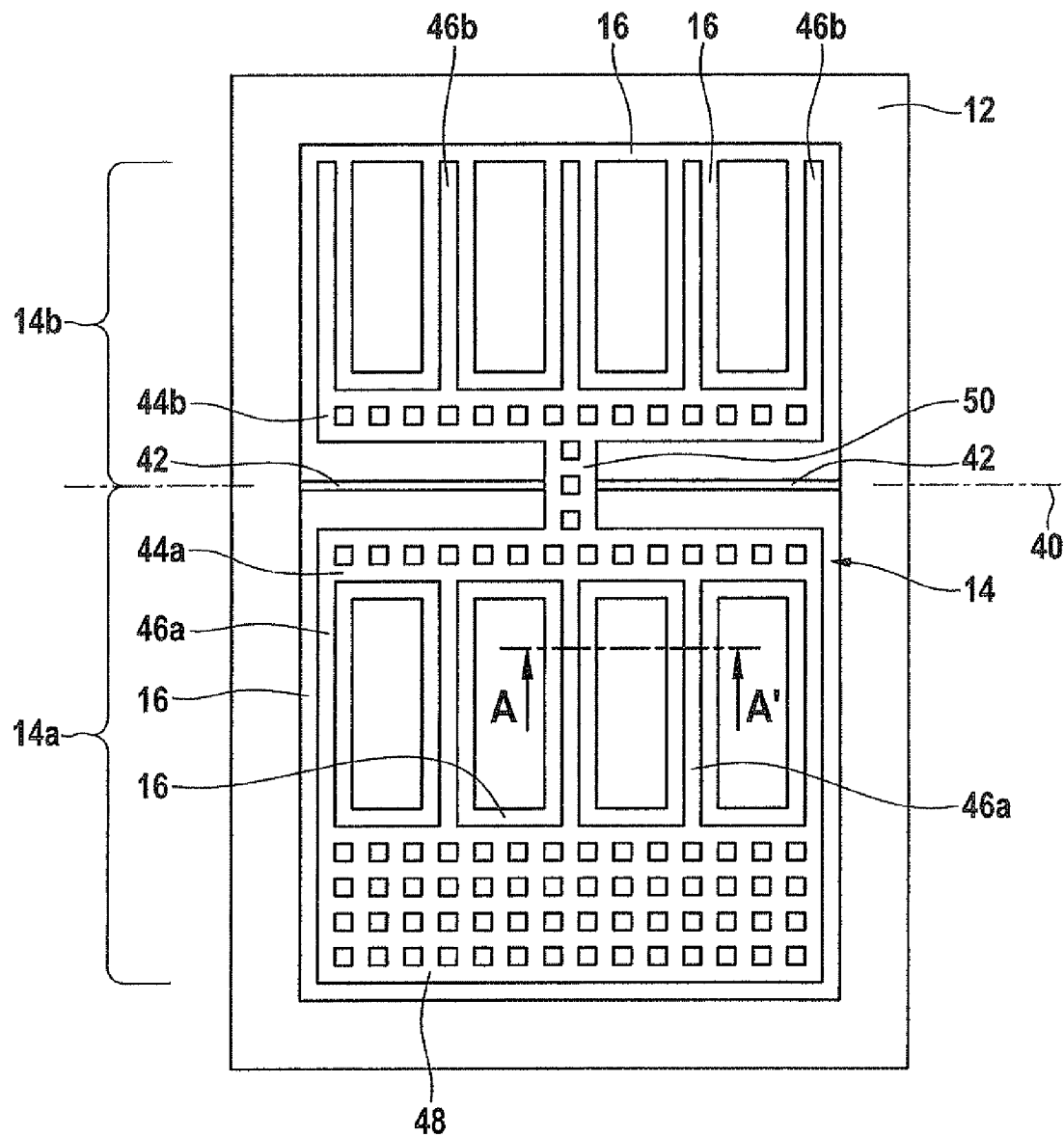

FIG. 1b shows a top view of front side 10 of substrate 12.

In the illustrated specific embodiment, movable mass 14 is connected to substrate 12 via two springs 42 which extend along a rotational axis 40. The two springs 42 are designed in such a way that movable mass 14 is tiltable with respect to substrate 12 about rotational axis 40.

Rotational axis 40 divides movable mass 14 into a first partial mass 14a having a first weight and a second partial mass 14b having a second weight which is less than the first weight. In other words, movable mass 14 is designed as an asymmetrical rocker which is displaceable about rotational axis 40. It is pointed out that the micromechanical component is not limited to a design of movable mass 14 as an asymmetrical rocker. The following descriptions of the asymmetrical rocker illustrate only one advantageous specific embodiment of movable mass 14.

In particular during an acceleration of the micromechanical component, movable mass 14 is deflected with respect to the substrate, as illustrated by arrow 13 in FIG. 1a. This deflection may be detected, ascertained, or measured via a relative change in capacitance between the at least one actuator electrode 20 and the at least one outer stator electrode 22, and via a relative change in capacitance between the at least one actuator electrode 20 and the at least one inner stator electrode 24, i.e., via the relative changes in capacitance of corresponding variables.

In the illustrated specific embodiment, first partial mass 14a and second partial mass 14b each have a connecting web 44a or 44b, respectively, from which multiple finger webs 46a or 46b situated on connecting web 44a or 44b, respectively, extend. (The cross section in FIG. 1a is a cross section of finger webs 46a parallel to rotational axis 40, along line AA'.) First partial mass 14a also includes an additional mass 48 which is situated at the ends of its finger webs 46a facing away from its connecting web 44a. The two connecting webs 44a and 44b may be connected to one another via a rocker web 50 which may be oriented perpendicularly to rotational axis 40.

Connecting web 44a and finger webs 46a of first partial mass 14a may have a mirror-symmetrical design with respect to second partial mass 14b, the axis of symmetry extending along rotational axis 40. In this case, an arrangement of electrodes 20 through 24 over the mirror-symmetrical regions of movable mass 14 ensures that only a displacement motion of movable mass 14 about rotational axis 40 results in a change in the capacitances of the capacitors formed from electrodes 20 through 24. Furthermore, the comb-shaped design of the mirror-symmetrical subregions of movable mass 14 ensures that even a comparatively small additional mass 28 brings about a sufficient asymmetry of the rocker.

In addition to the components described above, at least one integrated sensor and/or evaluation device (not illustrated) may also be provided in and/or on substrate 12.

Figure 1C:
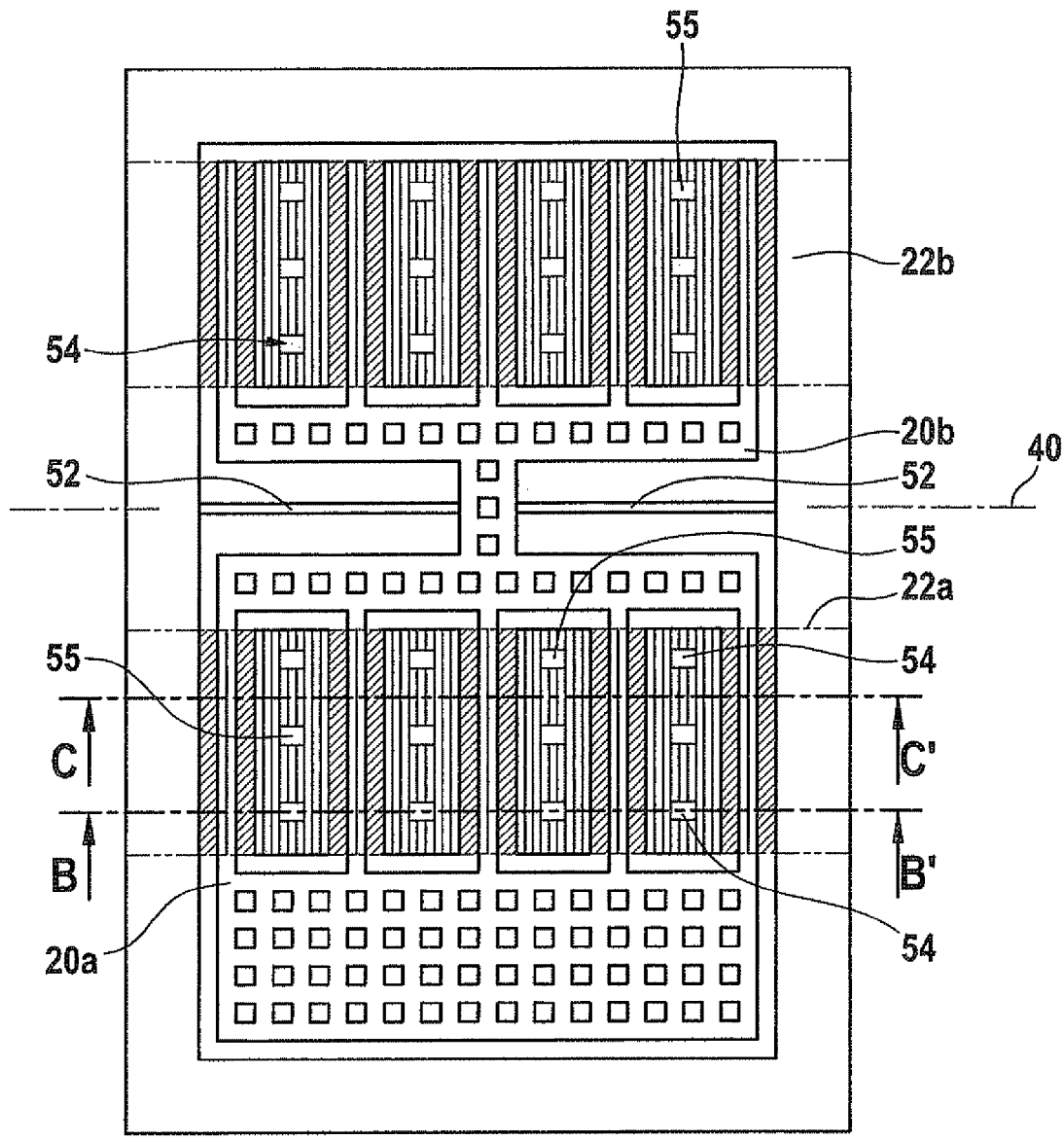

FIG. 1c shows a top view of outer stator electrodes 22a and 22b and actuator electrodes 20a and 20b of the micromechanical component. The inner stator electrodes are not illustrated for the sake of better clarity.

Outer stator electrodes 22a and 22b have a mirror-symmetrical design with respect to an axis of symmetry which extends parallel to rotational axis 40. In contrast, the shapes of actuator electrodes 20a and 20b situated therebeneath are adapted to the movable mass (not illustrated). Printed conductors 52 which extend in particular along the springs situated therebeneath may be used for contacting actuator electrodes 20a and 20b. For arranging outer stator electrodes 22a and 22b, the illustrated specific embodiment includes at least one stator supporting component 54, which is provided in the first space between the at least one outer stator electrode 22a and 22b and the front side of the substrate (not illustrated). Multiple stator supporting components 54 may be arranged in a uniform pattern, as described in greater detail below.

The at least one outer stator electrode 22a and 22b and/or the at least one actuator electrode 20a and 20b may be designed as a finely structured (transparent) lattice in their regions spanning the at least one separating trench 16. This allows etching of the at least one separating trench 16 after formation of electrodes 20 through 24. (The inner layer may have previously described gap 38 in its regions spanning the at least one separating trench 16). On the other hand, it is possible for cover regions 55 which overlap stator supporting components 54 to have no recess, which ensures good contact between cover regions 55 and stator supporting components 54.

Figure 1D:
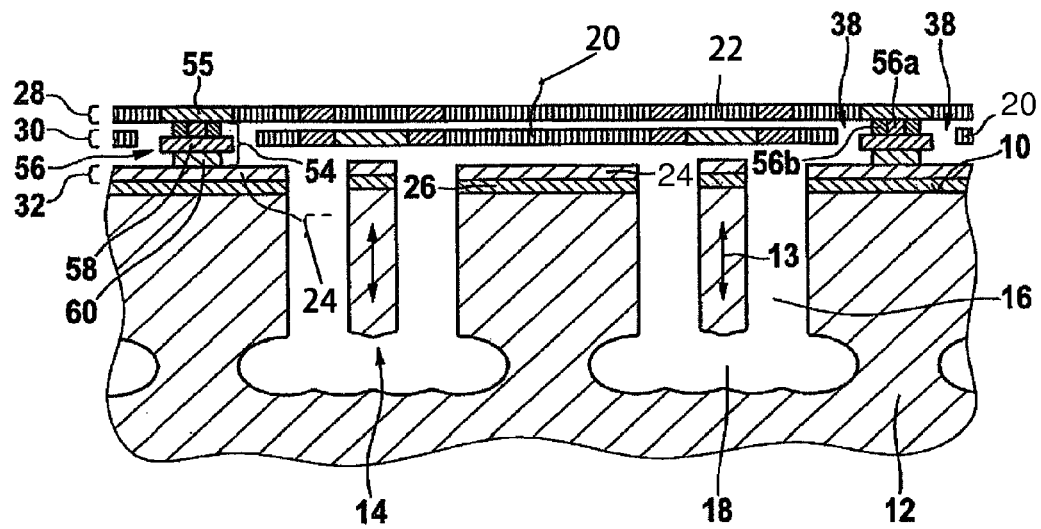

FIG. 1*d* shows a cross section along a line BB' from FIG. 1*c*, parallel to rotational axis 40 and through multiple stator supporting components 54.

Each of stator supporting components 54 includes one buffer area 56 between outer layer 28 and middle layer 30, one connecting region 58 made of middle layer 30, and one buffer area 60 between middle layer 30 and inner layer 32. Buffer area 60 between middle layer 30 and inner layer 32 is situated on a surface of inner layer 32 facing away from front side 10. A reliable and fixed connection of the at least one outer stator electrode 22 to the front side of substrate 12 is thus achievable without the need for an external suspension of the at least one outer stator electrode 22. Connecting regions 58 are structured/separated from middle layer 30 via an intermediate gap 38 which completely surrounds each connecting region. Each of connecting regions 58 is thus electrically insulated from the at least one actuator electrode 20. This ensures that the at least one outer stator electrode 22 is mechanically and electrically separated from the other electrodes 20 and 24. To ensure a particularly advantageous secure hold of the at least one outer stator electrode 22, buffer area 56 between outer layer 28 and middle layer 30 may include a core region 56*a* made of at least one metal and/or at least one semiconductor material, and a border region 56*b*, enveloping core region 56*a*, made of at least one insulating material. Buffer area 60 between middle layer 30 and inner layer 32 may be formed from at least one electrically insulating material.

Figure 1E:
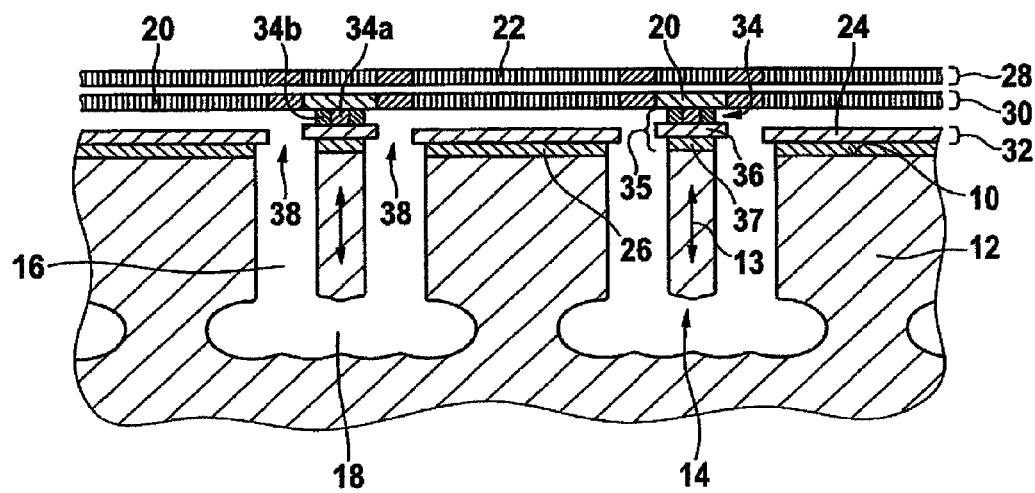

FIG. 1*e* shows a cross section along a line CC' from FIG. 1*c*, parallel to rotational axis 40 and through multiple actuator supporting components 35 (for comparison).

FIGS. 2*a* through 2*e* show cross sections of a substrate and top views of various layers of the substrate for illustrating a second specific embodiment of the micromechanical component.

The micromechanical component schematically represented in FIGS. 2*a* through 2*e* differs from the preceding specific embodiment solely by the advantageous design of finger webs 62 of movable mass 14. Therefore, further components 12 through 44*b* and 48 through 60 of the micromechanical component are not discussed here.

FIG. 2*a* shows a (partial) top view of a few finger webs 62 structured from substrate 14.

Schematically represented finger webs 62 have widenings in actuator contact areas 64 of the at least one actuator supporting component 35 which contacts the finger webs. The finger web has a much narrower design between two adjacent actuator contact areas 64 of a finger web 62. In this way, finger webs 62 may be implemented with a comparatively small average width, while at the same time ensuring reliable anchoring of the at least one actuator electrode 20 to actuator contact areas 64. The mass of the mirror-symmetrical regions of movable mass 14 may thus be additionally reduced as a result of the narrower design of finger webs 62 between actuator contact areas 64. Thus, a comparatively small additional mass 48 already brings about an advantageous asymmetry with respect to rotational axis 50. This ensures a reduction in the extension and/or the overall mass of movable mass 14.

The layers of stator contact regions 66 of stator supporting components 54 (perpendicular to front side 10) are also projected onto the plane of FIG. 2*a*. Actuator contact areas 64 and stator contact regions 66 may be arranged on the projection plane as two offset patterns composed of rows and columns in such a way that in a rectangle composed of four actuator contact areas 64, a stator contact region 66 is situated at an equal distance from the four actuator contact areas 64, and in a rectangle composed of four stator contact regions 66, an actuator contact area 64 is situated at an equal distance from the four stator contact regions 66. This may also be referred to as a configuration of actuator supporting components 35 and of stator supporting components 54 in a row-column pattern in each case, a stator supporting component 54 protruding into a rectangle composed of four actuator supporting components 35, at an equal distance from the four actuator supporting components 35, and an actuator supporting component 35 protruding into a rectangle composed of four stator supporting components 54, at an equal distance from the four stator supporting components 54. Such a configuration of contact areas 64 and 66, i.e., of supporting components 35 and 54, as offset row-column patterns ensures a reliable hold of the at least one outer stator electrode 22 on the substrate, and of the at least one actuator electrode 20 on movable mass 14.

FIG. 2*b* shows the subregion of the at least one outer stator electrode 22 situated above FIG. 2*a*. Cover regions 55 which overlap stator supporting components 54 may have no recess. On the other hand, the regions of the at least one outer stator electrode 22 surrounding cover regions 55 may be designed as a fine lattice.

Figure 2C:
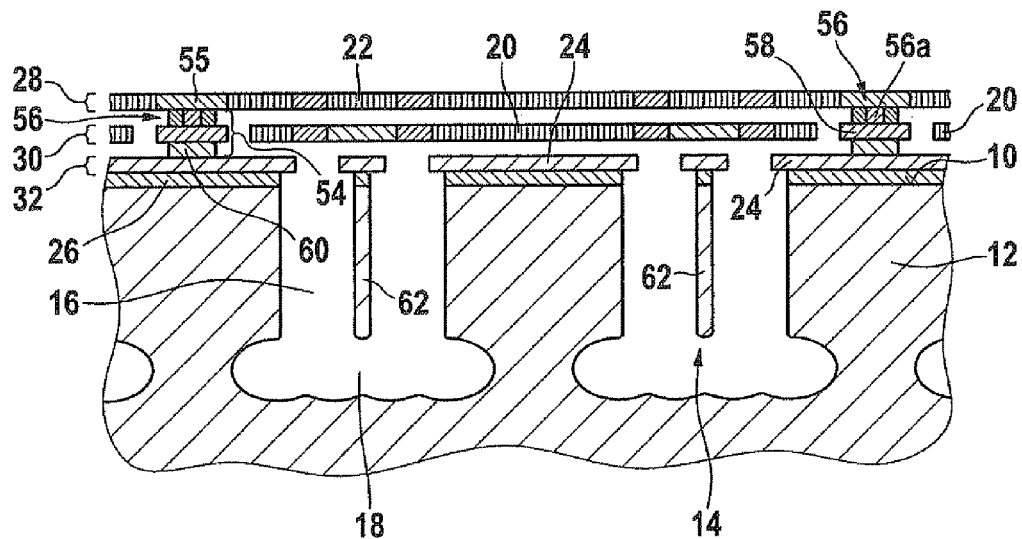
Figure 2D:
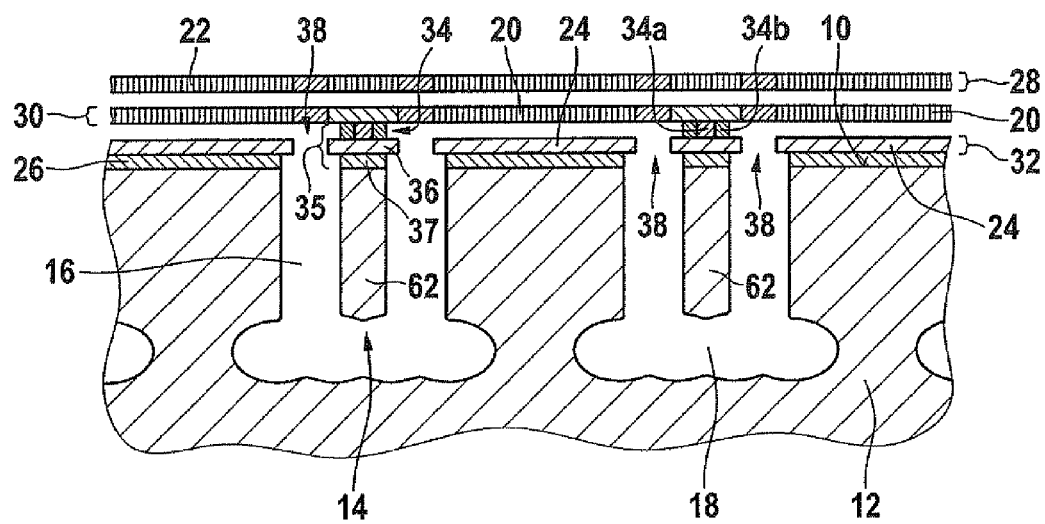
Figure 2E:
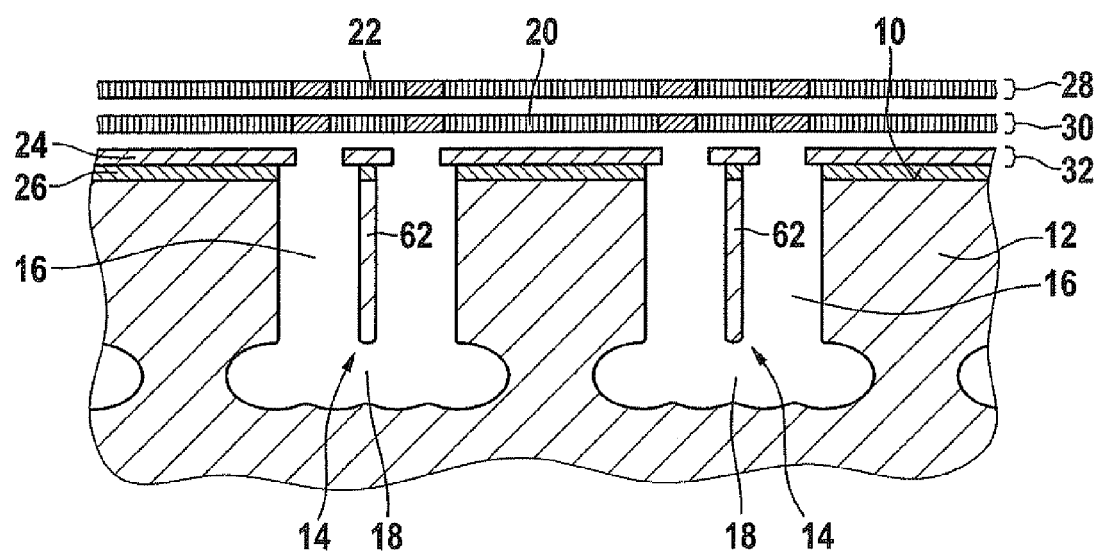

FIGS. 2*c* through 2*e* show cross sections along lines DD', EE', and FF', respectively, of FIG. 2*a*.

Figure 3A:
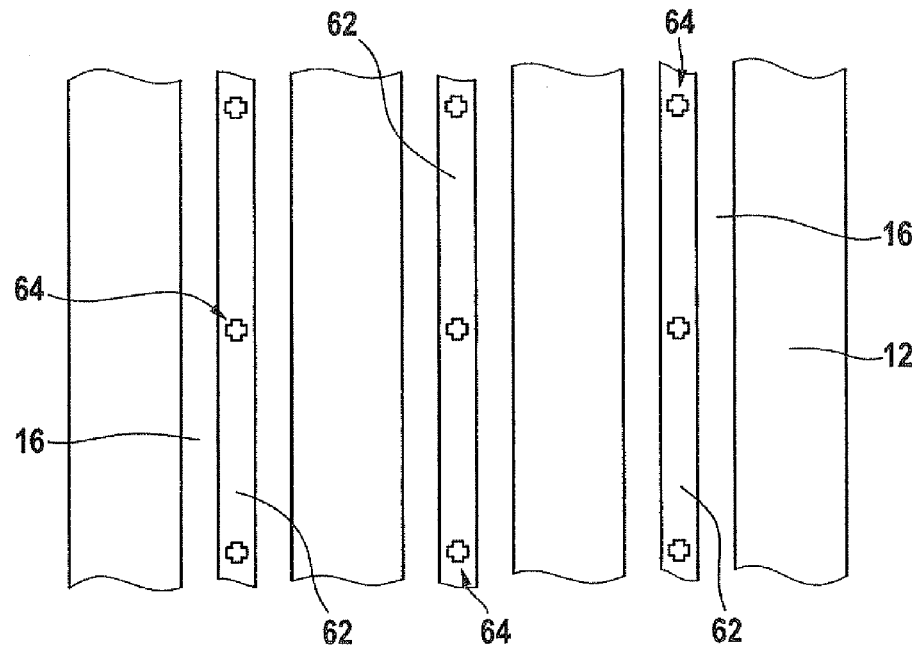
FIGS. 3a and 3b show top views of various layers of the substrate for illustrating a third specific embodiment of the micromechanical component.
Figure 3B:
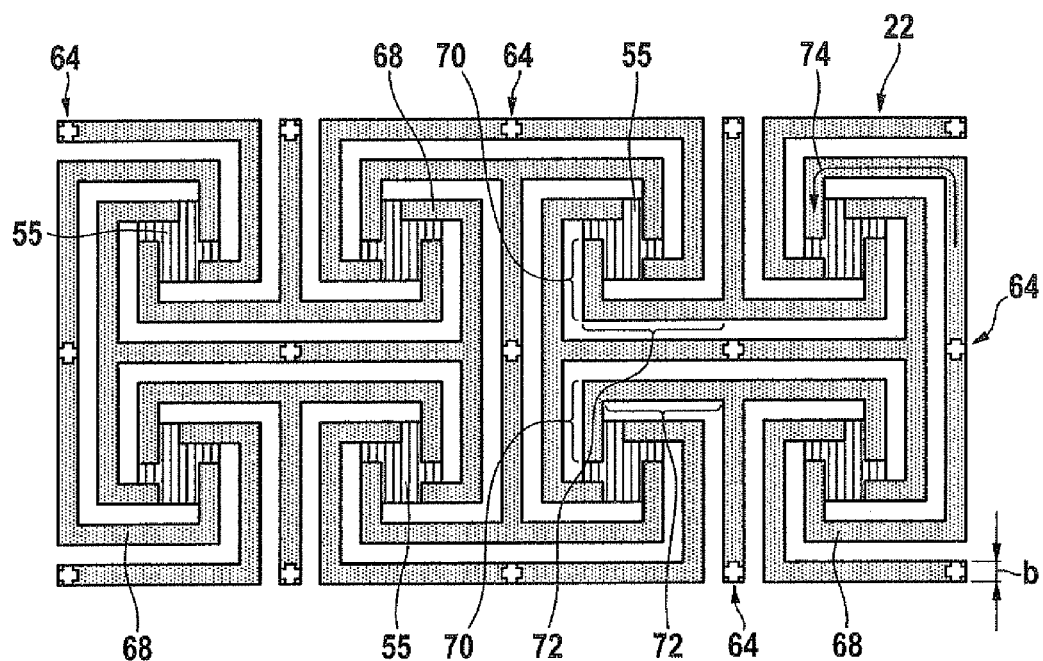

FIGS. 3*a* and 3*b* show top views of various layers of the substrate for illustrating a third specific embodiment of the micromechanical component.

The micromechanical component schematically represented in FIGS. 3*a* and 3*b* differs from the first specific embodiment solely by the design of the at least one outer stator electrode 22.

FIG. 3*a* shows a (partial) top view of finger webs 62 which are structured from substrate 12. FIG. 3*b* shows a (partial) top view of outer stator electrode 22 situated above the subregion of FIG. 3*a*.

Illustrated outer stator electrode 22 has at least one gridded area composed of strands 68 which are kinked at right angles. As an alternative or in addition to this type of gridded area composed of strands 68 which are kinked at right angles, outer stator electrode 22 may include gridded areas composed of jagged and/or bent strands (not shown). Width b of the jagged strands which are kinked and/or bent at right angles may be from 0.1µ to 3µ. The at least one actuator electrode 20 may also include gridded areas composed of jagged strands which are kinked and/or bent at right angles. It is possible to counteract mechanical stress in the at least one electrode 20 and 22 with the aid of this type of gridded structure/lattice structure.

In the illustrated specific embodiment, cover regions 55 are designed as compact areas or as fine lattices, strands 68 kinked at right angles being anchored to the corners/outer points of cover regions 55. Each of strands 68 kinked at right angles has at least one first partial strand 70, extending away from cover region 55, and one partial strand 72 extending perpendicularly to the first partial strand. Strands 68, kinked at right angles, of two adjacent cover regions 55 may have a mirror-symmetrical design with respect to an axis of symmetry extending between the two adjacent cover regions 55. It is thus possible for each of strands 68, kinked at right angles, of the two cover regions 55 to merge into one another (at partial strands 72). This design of strands 68 kinked at right angles may also be referred to as a meander structure, the individual cell of the largest meander merging at its corners into cover regions 55, or falling straight onto stator supporting components 54. A tensile or compression stress resulting from a rotational motion within strands 68 kinked at right angles, or within the meander, may thus be compensated for. In particular, transmission of mechanical stress is reliably prevented as a result of the two right-angled changes in direction along a course 74 of a strand 68 kinked at right angles.

The micromechanical components described in the above paragraphs may be used, for example, for an acceleration sensor, such as an out-of-plane acceleration sensor (Z acceleration sensor) in particular, or for a pressure sensor. However, the usability of the micromechanical components is not limited to an acceleration sensor or to a pressure sensor. For example, the micromechanical component may also include, as an addition, a coil which is fixedly mounted with respect to movable mass 14. When the micromechanical component is equipped with a coil which is fixedly mounted with respect to movable mass 14, an asymmetrical mass distribution of movable mass 14 may be dispensed with. When a current flows through the coil, in addition to the applied acceleration, an external magnetic field may also be measured via the measured deflection of the movable structure. Thus, the specific embodiments described above are also usable for a magnetic sensor.

For implementing a sensor device using the micromechanical component, an inexpensive evaluation device may be used which is designed to ascertain a first variable concerning a first capacitance of a first capacitor formed from the at least one outer stator electrode 22 and the at least one actuator electrode 20, and a second variable concerning a second capacitance of a second capacitor formed from the at least one inner stator electrode 24 and the at least one actuator electrode 20, and to determine and output information concerning an acceleration exerted on movable mass 14, a pressure exerted on movable mass 14, and/or a magnetic field in a region of a coil which is fixedly mounted with respect to movable mass 14, taking the ascertained first variable and the ascertained second variable into account.

FIG. 4 shows a flow chart for illustrating a first specific embodiment of the manufacturing method.

In a method step S1, a movable mass is connected to a substrate via at least one spring in such a way that the movable mass is displaceable with respect to the substrate at least from a first position into a second position. The movable mass is structured from the substrate with the aid of at least one separating trench. The at least one spring may be also structured from the substrate during the formation of the movable mass. Method step S1 may thus be carried out in a simple and cost-effective manner.

At least one actuator electrode is fixedly mounted with respect to the movable mass in a method step S2. The at least one actuator electrode may be connected to the movable mass in a punctiform manner via supporting components. The at least one actuator electrode may be freely suspended between the supporting components.

Method step S3 includes fixedly mounting multiple stator electrodes with respect to the substrate. In a method substep S31, at least one outer stator electrode is arranged in such a way that the at least one outer stator electrode spans at least one section of the separating trench and/or of the movable mass. After carrying out the method steps described here, the at least one actuator electrode protrudes at least into a first space between the at least one outer stator electrode and the substrate. In one advantageous specific embodiment, the at least one outer stator electrode is primarily designed as a lattice which almost completely overlaps the at least one actuator electrode. In a method substep S32, at least one inner stator electrode is additionally arranged in such a way that the at least one inner stator electrode protrudes at least into a second space between the at least one actuator electrode and the substrate. The at least one inner stator electrode may be anchored to the substrate over a large surface area, while the at least one outer stator electrode is anchored to the substrate in a punctiform manner via supporting components.

The descriptions of method steps S1 through S3, S31, and S32 do not specify a time sequence for carrying out method steps S1 through S3 or method substeps S31 and S32. Instead, method steps S1 through S3 and method substeps S31 and S32 may be carried out in a different sequence, as described below as an example.

In a method step which is not illustrated, at least one integrated sensor and/or evaluation device may be optimally provided in and/or on the substrate. The integrated sensor and/or evaluation device may be provided before or after method steps S1 through S3.

FIG. 5 shows a flow chart for illustrating a second specific embodiment of the manufacturing method.

At least one partial surface of a substrate is covered with an insulating layer in a method step S10. The insulating layer may, for example, include an oxide, in particular thermal silicon oxide.

An inner layer made of conductive material, for example a metal and/or a doped semiconductor material, is formed on the insulating layer in a method step S11. The inner layer includes the at least one inner stator electrode. Method substep S32 described above may thus be carried out as a substep of method step S11.

The inner layer is at least partially covered with a first sacrificial layer in a method step S12. A middle layer made of conductive material, including the at least one actuator electrode on the first sacrificial layer, is subsequently formed in a method step S13. Method step S2 described above is thus integratable into method step S13. A metal and/or a doped semiconductor material may likewise be used for the middle layer.

A method step S14 involves at least partially covering the middle layer with a second sacrificial layer. An outer layer made of conductive material, such as at least one metal and/or a doped semiconductor material, is formed on the second sacrificial layer in a method step S15. The at least one outer stator electrode (method substep S31) is also formed as at least part of the outer layer.

A method step S16 includes a first etching step in which at least partial regions of the second sacrificial layer, the first sacrificial layer, and the insulating layer are removed.

In a second etching step (method step S17), at least one trench is formed in at least one region of the substrate which is exposed during the first etching step. At least one protective layer may subsequently be formed in the at least one formed trench in a method step S18. This may be carried out in such a way that the at least one side wall of the at least one trench is covered by the at least one protective layer, while the at least one protective layer is removed from the at least one base surface of the at least one trench.

An isotropic third etching step carried out as method step S19 thus ensures undercutting of the regions of the movable mass which have already been structured from the substrate, without attacking same. Thus, with the aid of the isotropic third etching step the movable mass may be easily structured from the substrate in what may be a preferred shape. This may be ensured in particular without having to carry out the third etching step from a different etching direction than for the two preceding etching steps. The described method steps may thus be carried out using an inexpensive manufacturing unit.

In particular method steps S17 through S19 are thus a cost-effective formation of method step S1 described above.

The at least one actuator electrode and the at least one outer stator electrode may be designed as a fine lattice over large surface areas. This ensures that the three etching steps are carried out in a simple and reliable manner.

The method steps described above may also be used for manufacturing a sensor device, for example an acceleration sensor, a pressure sensor, or a magnetic sensor. For this purpose, it is only necessary to form the above-described evaluation device. Since an electronics system for the above-described functionality of the evaluation device is produced during manufacture of the evaluation device, this is not discussed in greater detail here.

What is claimed is:

1. A micromechanical component, comprising:
a substrate having at least one stator electrode which is fixedly mounted with respect to the substrate;
a movable mass having at least one actuator electrode which is fixedly mounted with respect to the movable mass; and
at least one spring via which the movable mass is connected to the substrate so that the movable mass is displaceable with respect to the substrate at least from a first position into a second position, wherein the movable mass is structured from the substrate with at least one separating trench;
at least one outer stator electrode spanning at least one section of the at least one separating trench or the movable mass, wherein the at least one actuator electrode protrudes at least into a first space between the at least one outer stator electrode and the substrate; and
at least one inner stator electrode protruding at least into a second space between the at least one actuator electrode and the substrate.

2. The micromechanical component of claim 1, wherein the at least one outer stator electrode is connected to the substrate with at least one stator supporting component situated in the first space.

3. The micromechanical component of claim 2, wherein a row-column pattern of the actuator supporting components is offset with respect to a row-column pattern of the stator supporting components so that one of the stator supporting components protrudes into a rectangle composed of four actuator supporting components, at an equal distance from the four actuator supporting components, and one of the actuator supporting components protrudes into a rectangle composed of four stator supporting components, at an equal distance from the four stator supporting components.

4. The micromechanical component of claim 1, further comprising at least one integrated sensor wherein the integrated sensor is provided at the substrate.

5. The micromechanical component of claim 1, wherein the micromechanical component includes an outer layer made of conductive material which includes the at least one outer stator electrode, a middle layer made of conductive material which includes the at least one actuator electrode, an inner layer made of conductive material which includes the at least one inner stator electrode, and at least one buffer area.

6. The micromechanical component of claim 5, wherein the buffer area includes at least one insulating material provided between the outer layer and the middle layer.

7. The micromechanical component of claim 5, wherein the buffer area includes at least one insulating material provided between the middle layer and the inner layer.

8. The micromechanical component of claim 5, wherein the buffer area includes at least one conductive material provided between the outer layer and the middle layer.

9. The micromechanical component of claim 5, wherein the buffer area includes at least one conductive material provided between the middle layer and the inner layer.

10. The micromechanical component of claim 1, wherein the movable mass is tiltable with respect to the substrate about a rotational axis which extends along the at least one spring, and wherein the rotational axis divides the movable mass into a first partial mass having a first weight, and a second partial mass having a second weight which is less than the first weight.

11. The micromechanical component of claim 10, wherein the first partial mass and the second partial mass each include a connecting web and multiple finger webs situated at the associated connecting web, the first partial mass also including an additional mass situated at the ends of its finger webs, facing away from its connecting web.

12. The micromechanical component of claim 11, wherein the finger webs contact actuator supporting components at actuator contact areas, have widenings located at the actuator contact areas of at least two actuator supporting components, and have a narrower design between two adjacent actuator contact areas.

13. The micromechanical component of claim 1, wherein at least one of (i) the at least one outer stator electrode, and (ii) the at least one actuator electrode include(s) gridded areas composed of jagged strands which are at least one of kinked and bent at right angles.

14. The micromechanical component of claim 1, wherein the at least one actuator electrode is connected to the movable mass with at least one actuator supporting component situated in the second space.

15. The micromechanical component of claim 14, wherein a row-column pattern of the actuator supporting components is offset with respect to a row-column pattern of the stator supporting components so that one of the stator supporting components protrudes into a rectangle composed of four actuator supporting components, at an equal distance from the four actuator supporting components, and one of the actuator supporting components protrudes into a rectangle composed of four stator supporting components, at an equal distance from the four stator supporting components.

16. The micromechanical component of claim 1, further comprising at least one evaluation device wherein the at least one evaluation device is provided at the substrate.

17. A sensor device, comprising:
a micromechanical component, including:
a substrate having at least one stator electrode which is fixedly mounted with respect to the substrate;
a movable mass having at least one actuator electrode which is fixedly mounted with respect to the movable mass; and
at least one spring via which the movable mass is connected to the substrate so that the movable mass is displaceable with respect to the substrate at least from a first position into a second position, wherein the movable mass is structured from the substrate with at least one separating trench;
at least one outer stator electrode spanning at least one section of the at least one separating trench or the movable mass, wherein the at least one actuator electrode protrudes at least into a first space between the at least one outer stator electrode and the substrate; and at least one inner stator electrode protruding at least into a second space between the at least one actuator electrode and the substrate; and an evaluation device which is configured to ascertain a first variable concerning a first capacitance of a first capacitor formed from the at least one outer stator electrode and the at least one actuator electrode, to ascertain a second variable concerning a second capacitance of a second capacitor formed from the at least one inner stator electrode and the at least one actuator electrode, to determine information by taking into account the ascertained first variable and the ascertained second variable, and to output the determined information.

18. The sensor device of claim 17, wherein the determined information is concerning acceleration exerted on the movable mass.

19. The sensor device of claim 17, wherein the determined information is concerning pressure exerted on the movable mass.

20. The sensor device of claim 17, wherein the determined information is concerning a magnetic field in a region of a coil which is fixedly mounted with respect to the movable mass.

21. A manufacturing method for a micromechanical component, the method comprising:
    connecting a movable mass via at least one spring to a substrate so that the movable mass is displaceable with respect to the substrate at least from a first position into a second position;
    fixedly mounting at least one stator electrode with respect to the substrate; and
    fixedly mounting at least one actuator electrode with respect to the movable mass;
    structuring at least the movable mass from the substrate with the aid of at least one separating trench;
    arranging at least one outer stator electrode so that the at least one outer stator electrode spans at least one section of the separating trench or the movable mass,
    arranging the at least one actuator electrode so that the at least one actuator electrode protrudes at least into a first space between the at least one outer stator electrode and the substrate; and
    arranging at least one inner stator electrode so that the at least one inner stator electrode protrudes at least into a second space between the at least one actuator electrode and the substrate.

22. The manufacturing method of claim 21, further comprising:
    performing the following prior to structuring the movable mass from the substrate:
    covering at least a partial surface of the substrate with an insulating layer;
    forming an inner layer made of conductive material, including the at least one inner stator electrode, on the insulating layer;
    at least partially covering the inner layer with a first sacrificial layer;
    forming a middle layer made of conductive material, including the at least one actuator electrode, on the first sacrificial layer;
    at least partially covering the middle layer with a second sacrificial layer; and
    forming an outer layer made of conductive material, including the at least one outer stator electrode, on the second sacrificial layer.

23. The manufacturing method of claim 22, further comprising:
    performing a first etching operation for removing at least partial regions of the second sacrificial layer, of the first sacrificial layer, and of the insulating layer;
    performing a second etching operation for forming at least one trench in at least one region of the substrate which is exposed in the at least one first etching operation;
    forming at least one protective layer in the at least one formed trench, the at least one side wall of the at least one trench being covered by the at least one protective layer, and the at least one protective layer being removed from the at least one base surface of the at least one trench; and
    performing an isotropic third etching operation so that at least the movable mass is structured from the substrate.

24. A manufacturing method for a sensor device, the method comprising:
    manufacturing a micromechanical component by performing the following:
    connecting a movable mass via at least one spring to a substrate so that the movable mass is displaceable with respect to the substrate at least from a first position into a second position;
    fixedly mounting at least one stator electrode with respect to the substrate; and
    fixedly mounting at least one actuator electrode with respect to the movable mass;
    structuring at least the movable mass from the substrate with the aid of at least one separating trench;
    arranging at least one outer stator electrode so that the at least one outer stator electrode spans at least one section of the separating trench or the movable mass;
    arranging the at least one actuator electrode so that the at least one actuator electrode protrudes at least into a first space between the at least one outer stator electrode and the substrate; and
    arranging at least one inner stator electrode so that the at least one inner stator electrode protrudes at least into a second space between the at least one actuator electrode and the substrate; and
    providing an evaluation device which is configured, during subsequent operation of the sensor device, to ascertain a first variable concerning a first capacitance of a first capacitor formed from the at least one outer stator electrode and the at least one actuator electrode, to ascertain a second variable concerning a second capacitance of a second capacitor formed from the at least one inner stator electrode and the at least one actuator electrode, and to determine and output information concerning at least one of an acceleration exerted on the movable mass, a pressure exerted on the movable mass, or a magnetic field in a region of a coil which is fixedly mounted with respect to the movable mass, taking the ascertained first variable and the ascertained second variable into account.

* * * * *